United States Patent
Ogimoto

(10) Patent No.: US 9,070,816 B2
(45) Date of Patent: *Jun. 30, 2015

(54) THERMOELECTRIC CONVERSION STRUCTURE AND METHOD OF MANUFACTURING SAME

(75) Inventor: Yasushi Ogimoto, Higashiyamato (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 132 days.

This patent is subject to a terminal disclaimer.

(21) Appl. No.: 13/878,957

(22) PCT Filed: Apr. 6, 2012

(86) PCT No.: PCT/JP2012/059519
§ 371 (c)(1),
(2), (4) Date: Jun. 5, 2013

(87) PCT Pub. No.: WO2012/157368
PCT Pub. Date: Nov. 22, 2012

(65) Prior Publication Data
US 2013/0255743 A1    Oct. 3, 2013

(30) Foreign Application Priority Data

May 19, 2011 (JP) .......................... PA 2011-111942

(51) Int. Cl.
| | |
|---|---|
| *H01L 35/14* | (2006.01) |
| *H01L 35/34* | (2006.01) |
| *C30B 29/32* | (2006.01) |
| *C30B 33/02* | (2006.01) |
| *H01L 35/22* | (2006.01) |
| *H01L 35/26* | (2006.01) |

(52) U.S. Cl.
CPC ............... *H01L 35/14* (2013.01); *C30B 29/32* (2013.01); *C30B 33/02* (2013.01); *H01L 35/22* (2013.01); *H01L 35/26* (2013.01); *H01L 35/34* (2013.01)

(58) Field of Classification Search
None
See application file for complete search history.

(56) References Cited

U.S. PATENT DOCUMENTS

| | | | |
|---|---|---|---|
| 2008/0105955 A1* | 5/2008 | Hao et al. | 257/627 |
| 2013/0140661 A1* | 6/2013 | Ogimoto | 257/421 |
| 2013/0149528 A1* | 6/2013 | Ogimoto | 428/336 |
| 2013/0189542 A1* | 7/2013 | Ogimoto | 428/701 |

(Continued)

FOREIGN PATENT DOCUMENTS

| | | |
|---|---|---|
| JP | 2000-159600 A | 6/2000 |
| JP | 2004-296629 A | 10/2004 |

OTHER PUBLICATIONS

H. Ohta et al., "Giant thermoelectric Seebeck coefficient of a two-dimensional electron gas in $SrTiO_3$", Nature Materials, vol. 6, No. 2, pp. 129-134, Feb. 2007.

(Continued)

*Primary Examiner* — David Sample
(74) *Attorney, Agent, or Firm* — Rabin & Berdo, P.C.

(57) ABSTRACT

A thermoelectric conversion material in which the electron spatial distribution assumes a wire structure or a quasi-one-dimensional structure is fabricated. A mode of the present invention provides a thermoelectric conversion structure 100 of a single crystal 10 of $SrTiO_3$ having a (210) plane surface or interface, and having, in the surface or interface, a concave-convex structure including terrace portions 12, 14 in (100) planes and step portions 16 extending along the surface in-plane [001] axis.

9 Claims, 7 Drawing Sheets

(56) References Cited

U.S. PATENT DOCUMENTS

2013/0247952 A1* 9/2013 Ogimoto .............. 136/238
2013/0255743 A1* 10/2013 Ogimoto .............. 136/238
2013/0337228 A1* 12/2013 Ogimoto .............. 428/141

OTHER PUBLICATIONS

T. Okuda et al., "Large thermoelectric response of metallic perovskites: $Sr_{1-x}La_xTiO_3$ ($0 \leq x \leq 0.1$)", Physical Review B, vol. 63, pp. 113104-1 to 113104-4, Mar. 2001.

* cited by examiner

THERMOELECTRIC CONVERSION STRUCTURE AND METHOD OF MANUFACTURING SAME

TECHNICAL FIELD

The present invention relates to a thermoelectric conversion structure and to a method of manufacturing such a structure. More specifically, the present invention relates to a thermoelectric conversion structure, used in an electricity generation element which uses differences in ambient temperature, and to a method of manufacturing such a structure.

BACKGROUND ART

In recent years energetic research has been conducted on so-called energy harvesting techniques for recovering electric power from waste energy, such as vibrations and heat, which normally is merely dissipated. For example, utilization is anticipated in vibration-generated power, which can be used as a power source for automobile tire pressure gauges and ubiquitous sensor networks, for example. On the other hand, thermoelectric generated power is applied only in niche fields such as for example watches which utilize the temperature differences between the human body and the environment. One reason for this is the low performance of the thermoelectric conversion materials used in thermoelectric elements. The performance index (or figure of merit) of thermoelectric conversion materials is expressed by $$Z = S^2/(\rho \cdot \kappa) \quad \text{equation (1)}$$

Here S is the Seebeck coefficient ($\mu$V/K), $\rho$ is the resistivity ($\Omega$-cm), and $\kappa$ is the thermal conductivity (W/(m·K)). The units of the figure of merit Z are $K^{-1}$, and as the efficiency of a thermoelectric element using a thermoelectric conversion material, often ZT, the product of the figure of merit and the usage temperature T (K), is used. The efficiency ZT of a conventional thermoelectric element using bulk material as the thermoelectric conversion material is approximately 1. It is thought that if a thermoelectric conversion material with efficiency ZT exceeding 3 could be fabricated, such a material could be substituted for compressors and other cooling systems used for example in refrigerators.

Satisfactory thermoelectric conversion materials have a large Seebeck coefficient S and low values of both resistivity and thermal conductivity. $Bi_2Te_3$ is a semimetal material which is representative of thermoelectric conversion materials currently in use. However, $Bi_2Te_3$ system materials are toxic and have a high environmental impact. Hence oxide materials which can be used as safer thermoelectric conversion materials have been attracting interest of late. One such material is $SrTiO_3$, a perovskite type oxide with an $ABO_3$ structure, doped with La at the A sites (Non-Patent Reference 1: T. Okuda et al, Phys. Rev. B, Vol. 63, 113104 (2001)). This material is a degenerate semiconductor with the n-type conduction.

Further, there have been theoretical proposals of methods to reduce the dimensions of the nano-scale structures of thermoelectric conversion materials, in order to improve the efficiency ZT of thermoelectric elements. Thermoelectric conversion materials have actually been trial-fabricated having a two-dimensionalized structure by using superlattices, and having a one-dimensional structure using whiskers. In these thermoelectric conversion materials, by reducing the dimensionality of the material microstructure and manipulating the state density distribution of conduction carriers, both an increase in the Seebeck coefficient S and reduction of the resistivity $\rho$ are achieved. Further, by reducing the dimensionality of the microstructure of a thermoelectric conversion material, phonon scattering is increased and the thermal conductivity $\kappa$ is lowered. That is, in a thermoelectric conversion material having a microstructure of reduced dimensionality, an increase in the value of the above-described figure of merit Z is attained. In particular, it has been reported that by adopting $Bi_2Te_3$ as a thermoelectric conversion material and fabricating a two-dimensionalized structure, the efficiency ZT has exceeded 2.

Further, it has been reported that even when adopting an oxide as a thermoelectric conversion material, by utilizing a two-dimensionalized structure, the efficiency ZT is increased (see Non-Patent Reference 2: H. Ohta et al, Nature Mater., Vol. 6, 129). Non-Patent Reference 2 reports that a superlattice comprising an n-type thermoelectric conversion material in which the B sites of $SrTiO_3$ were doped with Nb and insulating $SrTiO_3$ had an efficiency ZT of approximately 0.3, that when limited to the superlattice interfaces in particular the efficiency ZT exceeded 2, and that $Ca_3Co_4O_9$ (a p-type thermoelectric conversion material) whiskers exhibited an efficiency ZT of approximately 1. Through advances in thin film technologies in recent years, even in the case of oxide thermal conversion materials, fabricating superlattices (two-dimensional structures) such as those described above using oxides is not difficult. However, if an oxide is adopted in an attempt to fabricate a high-efficiency thermal conversion element, a number of problems arise. First, if an oxide is adopted, it is difficult to fabricate a one-dimensional structure, having dimensionality lower than two dimensions. Specifically, in order to fabricate a one-dimensional structure in an oxide, one conceivable method is to adopt a quantum wire which uses as a template a step of a step-terrace structure of a substrate. However, in order to use this method, fabrication conditions must be controlled such that film deposition in what is called step flow mode is realized. These fabrication conditions are conditions to always cause thin film growth only from the step portion, and consequently the process window is narrow and precise condition control is necessary. As a separate problem, linearity of substrate steps is not always ensured, and there is the problem that the linearity of quantum wires fabricated using such steps as a template is similarly not ensured.

As a method to resolve these problems, Patent Reference 1 (Japanese Patent Application Laid-open No. 2004-296629) discloses a method in which a single-crystal substrate inclined by a slight angle (from 0.2 to 15°) from an arbitrary face orientation is used. In this method, step bunching perpendicular to the inclination direction which is formed on the single crystal is utilized (see for example paragraph [0013] in Patent Reference 1). However, judging from the contents of the disclosure, what is formed on the inclined single-crystal surface disclosed in Patent Reference 1 are ordinary steps, and not bunched steps. In Patent Reference 1 it is stated that a buffer layer surface of a nonconductive material, fabricated on the single crystal inclined by a slight angle (0.2 to 15°), is used as the specific means of forming bunched steps, and that the bunching of steps formed can be used to fabricate thermoelectric conversion material with a wire structure. However, in the disclosure of Patent Reference 1, the reason for formation of bunched steps on the single crystal inclined by a slight angle (0.2 to 15°) is not disclosed.

Patent Reference 1: Japanese Patent Application Laid-open No. 2004-296629

Non-Patent Reference 1: T. Okuda et al, "Large thermoelectric response of metallic perovskites: Sr1-xLaxTiO3 (0<x<0.1)", Phys. Rev. B, Vol. 63, 113104 (2001)

Non-Patent Reference 2: H. Ohta et al, "Giant thermoelectric Seebeck coefficient of a two-dimensional electron gas in SrTiO3", Nature Mater., Vol. 6, 129 (2007)

The method of Patent Reference 1 above has the following problems. That is, (1) because step bunches are not formed on the substrate, a buffer layer must be formed. Further, (2) the linearity in the direction of extension in the bunched steps formed on the buffer layer is not ensured as the linearity in normal steps is not ensured. Hence even if bunched steps were formed, using the method of Patent Reference 1, a wire shape would not necessarily be determined with stability. Further, (3) in order to form in a wire shape the thermoelectric conversion member comprising thermoelectric conversion material extending along bunched steps, fabrication conditions must be controlled precisely so as to result in a step flow mode. Specifically, if there is two-dimensional growth in the thermoelectric conversion material not only from the step edge but also from the terrace surface, there are such problems as irregularity in the intervals between the thermoelectric conversion member wires, and merging of steps, so that wire widths change. In order to prevent such problems and cause growth to occur in step flow mode, the conditions of fabrication of the thermoelectric conversion material must be controlled with high precision.

This invention was devised in light of the above-described goals. By providing a thermoelectric conversion structure which can be fabricated easily and with good reproducibility to take the electronic structure of a quasi-one-dimensional structure, that is, a wire structure, this invention contributes to improvement of the performance of thermoelectric elements adopting such thermoelectric conversion structures.

DISCLOSURE OF THE INVENTION

The inventor of this application examined the abovementioned problems, and focused on the fact that near an $SrTiO_3$ surface and near an interface of $SrTiO_3$ with another film, an electronic system with spreading in two dimensions (hereafter called a "two-dimensional electronic system") is formed. Such a two-dimensional electronic system is distributed within the $SrTiO_3$ crystal near the interface, spreading along the surface or the interface.

The inventor of this application also focused on another experimental fact. This is the experimental fact that in the surface of a $SrTiO_3$ single crystal, a concave-convex structure can be formed, the direction of which is determined reflecting the crystal axis directions at the surface.

By combining knowledge based on these facts, the inventor of this application discovered that a useful thermoelectric conversion structure is provided, culminating in the creation of this invention.

That is, in one mode of this invention, a thermoelectric conversion structure is provided in which an $SrTiO_3$ single crystal has a surface or interface at a (210) plane, and at the surface or interface a concave-convex structure is formed which includes a terrace portion in the (100) plane and a step portion extending along the [001] axis in the plane.

In this mode, a concave-convex structure, comprising a terrace portion on a (100) plane and a step portion extending along the [001] axis in the surface, that is, a concave-convex structure defined by a crystal axis and a crystal face, is formed on the surface of a $SrTiO_3$ single crystal. By this means, in a two-dimensional electronic system formed near the surface in a $SrTiO_3$ single crystal without a concave-convex structure, the dimensionality can be further reduced by means of the concave-convex structure. In a $SrTiO_3$ single crystal the surface of which is in a flat state and with no particular structure, a two-dimensional electronic structure is formed, as described above. When the abovementioned concave-convex structure is formed in the surface of such a single crystal, the two-dimensional electronic system is affected by the concave-convex structure, and an in-plane anisotropy occurs. That is, a one-dimensional directionality appears in the macroscopic electrical conductivity with respect to two directions which from symmetry had been equivalent in the two-dimensional electronic system, that is, the direction of the in-plane [001] axis and the direction of the in-plane axis perpendicular thereto. According to studies by the inventor of this application, this anisotropy in the electrical conductivity also affects the Seebeck coefficient. Moreover, this anisotropy can be clearly detected not only at low temperatures, but in the range of room temperature as well (for example at approximately 300 K). In this way, an improvement at room temperature in the Seebeck coefficient of $SrTiO_3$ single crystal is attained. Hereafter, an arbitrary spatial distribution of electrons causing differences in the macroscopic electric conductivity due to further reduction of the dimensions of a two-dimensional electronic system, such as the concave-convex structure of this mode, is called a quasi-one-dimensional structure. In particular, according to expectations of the inventor of this application, the spatial distribution of electrons in a thermoelectric conversion structure of this mode will, under the influence of the concave-convex structure, be that of numerous long, thin line-shape spatial distributions of electrons, arranged in parallel in one direction according to the concave-convex structure. That is, the two-dimensional electronic system is squeezed at each line by the concave-convex structure to assume a distribution of stripe shapes. Electrons having such a spatial distribution are included in the quasi-one-dimensional electronic system of this application.

Further, in a thermoelectric conversion structure of this mode, a concave-convex structure based on the crystalline anisotropy of the single crystal is used, so that linearity in the quasi-one-dimensional structure in the abovementioned electronic spatial distribution, that is, linearity of the quasi-one-dimensional electronic system, is ensured. Further, a buffer layer to form bunched steps is not necessary in this mode, and formation of new thermoelectric conversion material in a wire shape in step flow mode is also not necessary. That is, in the thermoelectric conversion structure of this mode, the problems of methods of the prior art are avoided. In this way, the figure of merit Z of the thermoelectric conversion structure can be improved easily and with good reproducibility.

Further, in one mode of this invention, the above-described thermoelectric conversion structure is provided, in which an oxide additional layer of a rock salt crystal structure of any of LaO, PrO and NdO is formed upon at least a portion of the aforementioned concave-convex structure in contact with the surface or interface.

By forming an oxide additional layer of a rock salt structure above the surface of a $SrTiO_3$ single crystal with a (210) orientation as in this mode, the electronic structure within the $SrTiO_3$ single crystal near the interface between the $SrTiO_3$ single crystal and the oxide additional layer can be doped with electrons as carriers. Consequently in the quasi-one-dimensional electronic system, which is squeezed using the concave-convex structure at the surface or interface of the above-described thermoelectric conversion structure, the carrier density can be increased. In the $SrTiO_3$ single crystal having the quasi-one-dimensional electronic system with increased carrier density, the electronic structure becomes that of a degenerate semiconductor, and the electrical resistivity $\rho$ declines. Due to this decline in the electrical resistivity, the figure of merit Z of the oxide thermoelectric conversion structure is further improved, and this mode results in a preferred configuration including an oxide additional layer.

Further, in one mode of this invention, the above-described thermoelectric conversion structure is provided, in which an oxide additional layer having a perovskite crystal structure having any of La, Pr and Nd at A sites is formed upon at least a portion of the aforementioned concave-convex structure in contact with the aforementioned surface or interface.

In this mode also, among the above-described thermoelectric conversion structure, the quasi-one-dimensional electronic system formed near the surface of the $SrTiO_3$ single crystal with (210) orientation can be doped with electrons from an oxide additional layer. Hence in this mode, similarly to the mode in which a rock salt structure oxide additional layer is formed, the carrier density of the quasi-one-dimensional electronic system squeezed by the concave-convex structure is increased, and consequently the advantageous result of a degenerate semiconductor electronic structure is obtained. By increasing the carrier density the figure of merit Z is further improved, so that this mode results in a preferred configuration including an oxide additional layer. In addition, in this mode the oxide additional layer has the same perovskite structure as $SrTiO_3$, so that treatment to form the oxide additional layer is comparatively easy, and fabrication is easy. Preferred examples of a perovskite type oxide additional layer include $LaAlO_3$, $PrAlO_3$, $NdAlO_3$, and similar.

The oxide additional layers in the abovementioned two modes, when in contact with the surface or interface of the $SrTiO_3$ single crystal, are not formed in a uniformly spreading planar shape due to formation of the concave-convex structure, and are discontinuous or are otherwise affected by the terrace portion and the step portion. Hence the structure of the oxide additional layer also exhibits in-plane anisotropy similar to the electron spatial distribution near the surface or interface of the above-described $SrTiO_3$ single crystal. For this reason, the term "quasi-one-dimensional structure" is also used when explaining the structure of an oxide additional layer.

In addition, in one mode of this invention, the above-described thermoelectric conversion structure is provided, in which the layer thickness of any one of the oxide additional layers formed above the aforementioned concave-convex structure is 5 unit cells or greater when measured in the [100] axis direction of the aforementioned thermoelectric conversion structure.

Further, in one mode of this invention, the above-described thermoelectric conversion structure is provided, in which the layer thickness of any one of the oxide additional layers formed above the aforementioned concave-convex structure is equal to or less than the difference in heights of the aforementioned concave-convex structure.

In these modes also, the quasi-one-dimensional electronic system, obtained by squeezing the two-dimensional electronic system near the surface of the $SrTiO_3$, is doped with electrons. Consequently the electron structure of the $SrTiO_3$ single crystal is that of a degenerate semiconductor. In addition, in these modes, the effects of the concave-convex structure extend to the position itself at which the oxide additional layer with a rock salt structure or perovskite type structure is formed, on the concave-convex structure at the surface or interface of the single crystal; for example, in some cases a wire structure results. In this case, of the quasi-one-dimensional electronic system formed near the surface of the $SrTiO_3$, electron doping occurs selectively only at positions in contact with the oxide additional layer. Hence the one-dimensional properties of the electronic system, which is already squeezed to become a quasi-one-dimensional electronic system, are further intensified.

In one mode of this invention, a method of manufacturing a thermoelectric conversion structure is provided, including a step of forming on the aforementioned surface a concave-convex structure including a terrace portion on a (100) plane and a step portion extending along an in-plane [001] axis by annealing in air of a $SrTiO_3$ single crystal having a (210) plane surface.

Further, in one mode of this invention, the above-described method of manufacturing a thermoelectric conversion structure is provided, further including a step of forming an oxide additional layer having a rock salt structured crystal structure or a perovskite type crystal structure, in contact with the surface of at least a portion of the aforementioned concave-convex structure.

By means of these modes, thermoelectric conversion structures with improved performance can be provided.

In any one of the modes of this invention, an oxide thermoelectric conversion structure having a quasi-one-dimensional structure electron spatial distribution is provided.

BRIEF DESCRIPTION OF THE DRAWINGS

FIG. 2 shows schematic side views of the crystal lattice with (210) face orientation in $SrTiO_3$ single crystal or the cubic perovskite structure of the oxide additional layer of an embodiment of the invention, in which FIG. 2A is a side view seen from the in-plane [1-20] axis and FIG. 2B is a side view seen from the in-plane [001] axis;

BEST MODE FOR CARRYING OUT THE INVENTION

Figure 1:
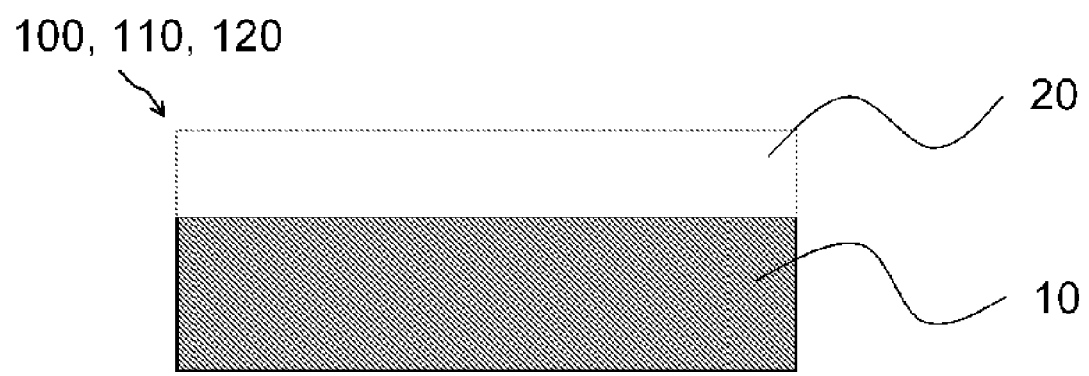
FIG. 1 is a schematic cross-sectional view of the thermoelectric conversion element of an embodiment of the invention.

Below, embodiments of thermoelectric conversion structures using perovskite type manganese oxides of this invention are explained. In the following explanations, unless stated otherwise, portions or elements common to all the drawings are assigned common reference symbols. Further, in the drawings, elements of embodiments are not necessarily shown to scale.

First Embodiment

Below, an embodiment of a thermoelectric conversion material of this invention is explained based on the drawings. Here a $SrTiO_3$ thermoelectric conversion structure is explained, in the surface of which is formed a concave-convex structure defined by the [001] axis and (100) plane of a (210) orientation $SrTiO_3$ single crystal surface. In particular, the ease with which the thermoelectric conversion structure is formed with good reproducibility, having an electron spatial distribution with a quasi-one-dimensional structure fabricated using the concave-convex structure, is explained.

1 STRUCTURE

1-1 Overall Structure

First, the configuration of the thermoelectric conversion structure of this embodiment is explained. FIG. 1 is a schematic cross-sectional view showing the configuration of the thermoelectric conversion structure 100 of this embodiment. The thermoelectric conversion structure 100 comprises a single crystal 10. As explained below, the single crystal 10 comprises a single crystal of $SrTiO_3$, in the surface of which is a microscopic concave-convex structure. A carrier doping structure 20 is formed so as to be in contact with the surface of this $SrTiO_3$ single crystal. In FIG. 1, the vertical direction in the plane of the paper is perpendicular to the single crystal face, and the horizontal direction is parallel to the single crystal face. The single crystal 10 comprises a $SrTiO_3$ single crystal thermoelectric conversion material.

1-2 Crystal Structure

Figure 2:
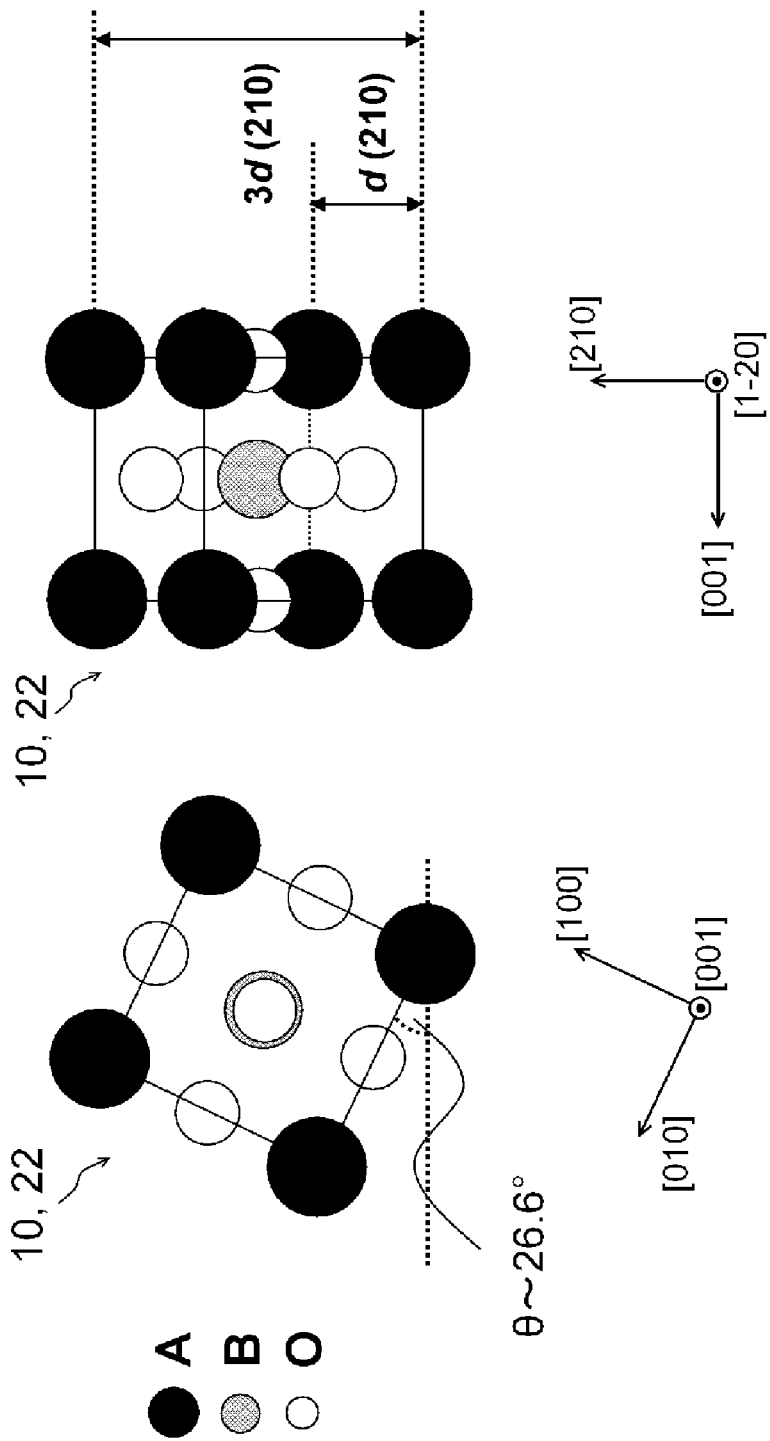

The (210) orientation in the cubic perovskite structure is explained referring to FIG. 2. This cubic perovskite stricture is the crystal structure of the single crystal 10, which in this embodiment is a $SrTiO_3$ single crystal. The perovskite structure is denoted by $ABO_3$, where A atoms occupy vertices, the B atom is at the body center, and O (oxygen) atoms occupy each of the face center positions. In the explanation of this embodiment, vertex sites are called A sites, and atoms occupying these sites are called A atoms. The vertical direction in the plane of the paper is taken to be the direction perpendicular to the single crystal surface (hereafter called the "direction perpendicular to the surface"); FIG. 2A is a cross-sectional view seen from the in-plane [001] axis, and FIG. 2B is a cross-sectional view seen from the in-plane [1-20] axis orthogonal thereto. In this cubic perovskite structure, the angle of the (100) plane measured from the (210) plane is given by equation (2).

$$\theta = \arctan(\frac{1}{2}) \quad \text{equation (2)}$$

That is, θ is approximately 26.6°, and atomic planes are stacked in alternation as $AO-BO_2-AO$ . . . in the direction perpendicular to the surface. In the $SrTiO_3$ (210) single crystal 10, the plane interval of (210) planes in the direction perpendicular to the surface is found from $$d(210) = a \cdot \sin\theta \quad \text{equation (3)}$$

and is approximately 0.1746 nm. Here a is the $SrTiO_3$ lattice constant (=0.3905 nm). Taking the view that the cubic crystal unit cell is inclined approximately 26.6° from the (100) orientation, the interval in the direction perpendicular to the surface, 3d(210), is approximately 0.5238 nm. The length in the direction perpendicular to the surface taking in-plane atom position periodicity into consideration, 5d(210), is approximately 0.873 nm.

1-3 Surface Structure of Single Crystal

Figure 3:
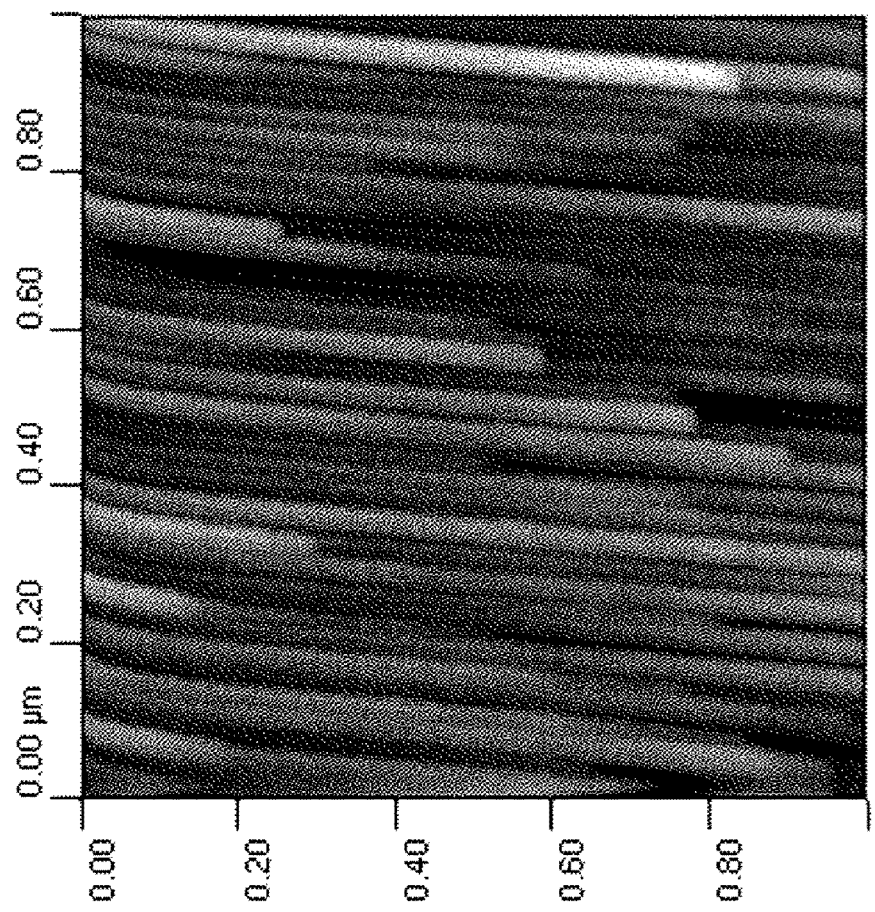
FIG. 3 is an AFM image of the surface of the (210) orientation of a $SrTiO_3$ single crystal after annealing in air for 12 hours at 1180° C., in one embodiment of the invention.
Figure 4:
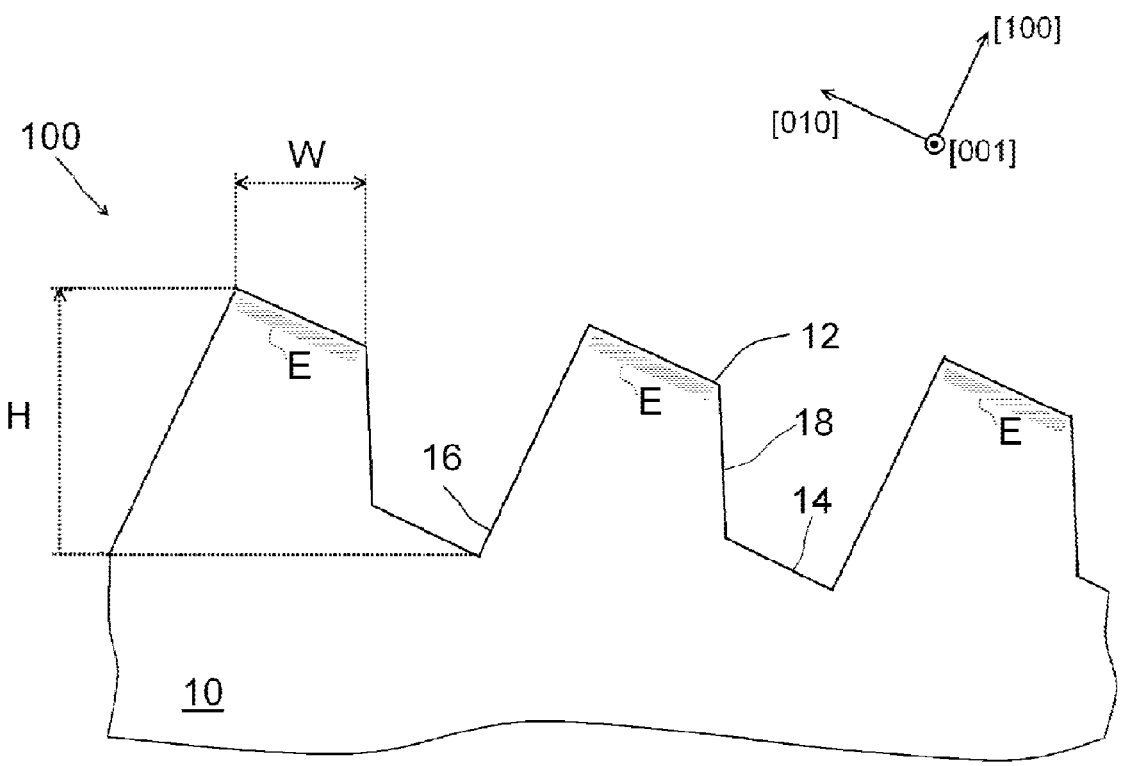
FIG. 4 shows a concave-convex structure comprising a (100) plane terrace portion and a step portion extending parallel to the [001] axis direction, formed in the surface of a (210) orientation $SrTiO_3$ single crystal after annealing in air for 12 hours at 1180° C., in one embodiment of the invention.

Next, the surface structure of the single crystal 10, which is a $SrTiO_3$ (210) orientation single crystal, is explained. FIG. 3 shows an AFM image of the surface of the single crystal 10 used in the thermoelectric conversion structure 100 of this embodiment. FIG. 4 is a schematic cross-sectional view showing with enlargement the structure near the surface of the single crystal 10. As shown in FIG. 4, in the single crystal 10 is formed a concave-convex structure, including terrace portions 12 and 14 based on (100) planes at the surface of the single crystal, and step portions 16 extending along the in-plane axis [001].

In the thermoelectric conversion structure 100, the terrace portions 12 and 14 on (100) planes of the single crystal surface and the step portions 16 extending parallel to the in-plane axis are not formed in the procurement stage. That is, the surface of the single crystal in the procurement stage is flat at the nanometer level, and no regular structure is observed. Upon annealing this $SrTiO_3$ (210) single crystal in air at 1180° C. for 12 hours, a concave-convex structure such as seen in FIG. 3 and FIG. 4 is observed. Specifically, as shown in FIG. 4, narrow terrace portions 12, 14 the width W of which is approximately 20 nm and of length 1 μm or greater extend in the [001] axis direction in the surface of the single crystal 10. Measurement of the difference in heights H when tracing the surface in the direction of the [1-20] axis indicates that the difference in heights is approximately 6 nm. This difference in heights H thus formed, converted into the number of unit cells of the $SrTiO_3$ which is the material of the single crystal 10, is fixed at approximately 12. And as shown in FIG. 4, in the surface of the single crystal 10, the numerous terrace portions 12, 14 are all formed exposing a (100) plane, and the numerous terrace portions 12, 14 are all connected together by step portions 16 and reverse-step portions 18. Of these step portions, the step portions 16 are formed by (100) planes. On the other hand, the planes of the reverse-step portions 18 are not fixed. However, the concave-convex structure is definitely formed by combining the terrace portions 12, 14 and step portions 16, 18 so as to result in large height differences H. The terrace portions 12, 14 and step portions 16, 18 all extend in the [001] axis direction, and are disposed so as to be arranged in the [1-20] axis direction. Of importance for practical purposes is that the abovementioned concave-convex structure is a step formed autonomously by heat treatment. That is, the terrace portions 12, 14 and step portions 16, the face directions and direction of extension of which are highly reproducible, reflecting the properties of the crystal faces and crystal axis of the crystal, are formed autonomously solely by heat treatment.

1-4 Electronic State

Here, the electronic structure in a $SrTiO_3$ single crystal having a concave-convex structure such as that shown in FIG. 4 is explained. As explained above, at the time of procurement, a $SrTiO_3$ single crystal does not have a particular concave-convex structure in the surface. Near the surface, the electronic structure of the $SrTiO_3$ single crystal is known to be similar to a two-dimensional electron gas having a planar spreading along the surface. However, when a concave-convex structure such as that shown in FIG. 4 is formed, this two-dimensional electron gas is affected by the concavities and convexities, and only the portions of the terrace portions 12, for example, are squeezed. In FIG. 4, an example is schematically shown of an electron distribution E extending in the front-back direction in the plane of the paper, which is the [001] axis, due to this squeezing. The electron distribution E extends in the direction perpendicular to the plane of the paper in FIG. 4, and due to the influence of for example the step portions 16 and 18, is interrupted in the horizontal direction in the plane of the paper in FIG. 4. Hence at the surface of the SrTiO₃ single crystal, by utilizing the concave-convex structure, a wire structure or stripe structure electronic system, that is, a quasi-one-dimensional electronic system, generally spreading over the substrate face which is the (210) plane and extending along the [001] axis direction, is formed. In general, the electronic state of bulk SrTiO₃ single crystal, which assumes the perovskite structure, not only is approximated by an electron gas, but is theoretically determined to behave as a strongly correlated electron system or so-called Tomonaga-Luttinger liquid. In this case also, a quasi-one-dimensional electronic structure is realized using the above-described concave-convex structure.

1-5 Modified Example

Oxide Additional Layer

In this embodiment, as a modified example of the thermoelectric conversion structure 100, thermoelectric conversion structures 110 and 120 having carrier-doped structures 20 added by arbitrary selection are provided. A carrier-doped structure 20 is grown epitaxially on the surface of the single crystal 10, is formed above the concave-convex structure of the single crystal 10, and is a layer having an arbitrary structure of an arbitrary material, having the property of providing electrons or other conduction carriers to the single crystal 10.

Here, a typical carrier-doping structure 20 is a single-crystal layer, and is for example a rock salt-structure oxide additional layer 21 in the thermoelectric conversion structure 110, or is a perovskite-structure oxide additional layer 22 in the thermoelectric conversion structure 120. Of these, the oxide additional layer 22 of the thermoelectric conversion structure 120 assumes the perovskite crystal structure explained referring to FIG. 2.

Figure 5:
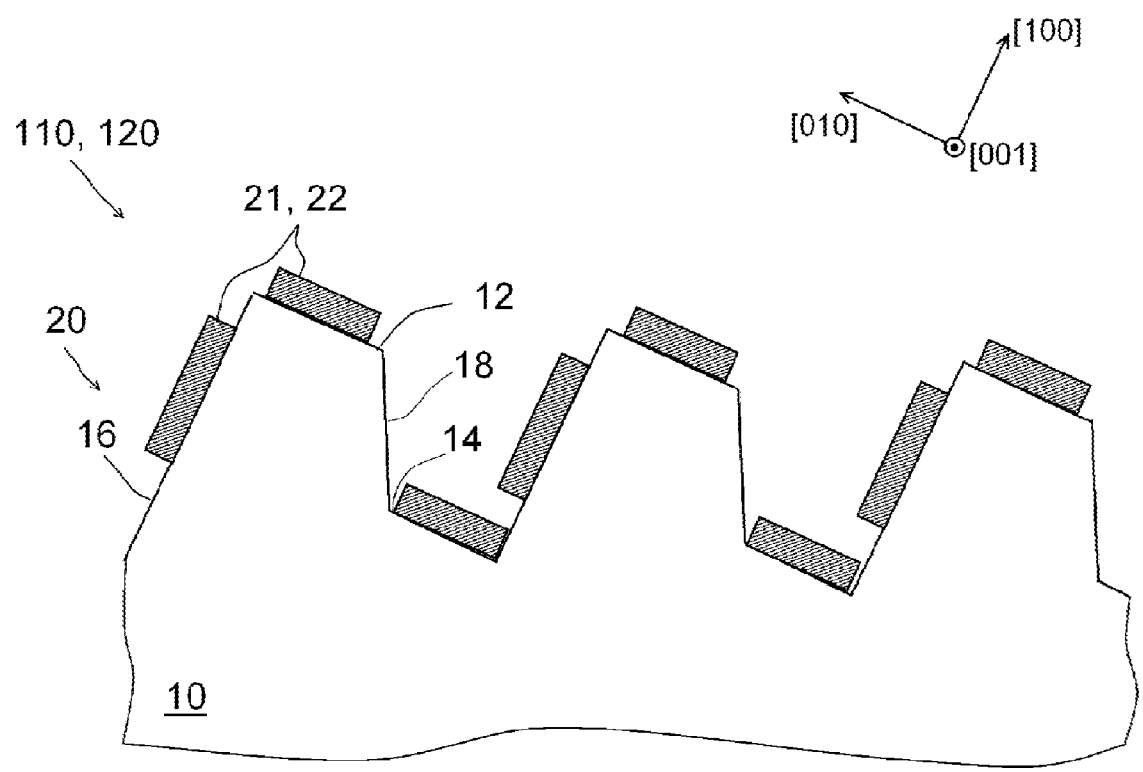
FIG. 5 is a schematic cross-sectional view of a thermoelectric conversion structure having a carrier-doped structure comprising an oxide additional layer on a concave-convex structure comprising a terrace portion on the (100) plane and a step portion extending parallel to the [001] axis direction of a (210) orientation $SrTiO_3$ single crystal, in one embodiment of the invention.

FIG. 5 shows, as a cross-sectional view, the configuration of the thermoelectric conversion structures 110 and 120, having a carrier-doping structure 20 formed on the single crystal 10. FIG. 5 is a cross-sectional view in a case in which each of the long narrow strips of the carrier-doping structure 20 extending in the [001] axis direction are cut by the plane perpendicular to the [001] axis. As shown in FIG. 5, the oxide additional layer 22 in the carrier-doping structure 20 is disposed on the surface of the single crystal 10 with the concave-convex structure, and is disposed in accordance with the electron spatial distribution (FIG. 4), which already assumes a quasi-one-dimensional structure. Hence the electronic system is effectively doped with carriers supplied from the oxide additional layer 22 to the electronic system formed near the interface of the single crystal 10.

1-5-1 Perovskite Structure Oxide Additional Layer

One modified example of this embodiment is a thermoelectric conversion structure 120 having as the carrier-doping structure 20 a perovskite structure oxide additional layer 22. Here, the lattice constants of the perovskite structure crystal lattices are substantially the same in the single crystal 10 and in the oxide additional layer 22. Hence the perovskite crystal structure shown in FIG. 2 is the crystal structure, including the orientation, of the oxide additional layer 22, which is the carrier-doping structure 20, as well. Further, the oxide additional layer 22 can be epitaxially grown on the single crystal 10. Preferred materials for the oxide additional layer 22 are, in addition to lanthanides, perovskite type crystal structure oxides with any among La, Pr, and Nd at the A sites.

The thermoelectric conversion structure 120 comprises the single crystal 10, which is a (210) orientation single crystal of SrTiO₃, and a carrier-doping structure 20 formed on a concave-convex structure in the surface of the single crystal 10 having step portions 16, 18 parallel to the [001] axis direction and terrace portions 12, 14 on (100) planes. Here, the carrier-doping structure 20 is a structure in which numerous long narrow strips of an oxide additional layer 22 are arranged. Of the step portions 16 and 18, the step portions 16 are (010) plane surfaces. The oxide additional layer 22 covers at least a portion of the surface of this concave-convex structure. Here, the oxide additional layer 22 has a structure in which long narrow strips are arranged in stripe shapes, and the layer itself also has a quasi-one-dimensional structure. That is, in the concave-convex structure of the single crystal 10, the (100) planes are inclined by 26.6° from the (210) planes, and the shape when traversing the (100) plane terrace portions 12, 14 is not linear, but described concavities and convexities. Hence the oxide additional layer 22 effectively assumes a quasi-one-dimensional structure due to being cut into individual strips by the concave-convex structure created by the terrace portions 12, 14 and step portions 16, 18.

In the carrier-doping structure 20, current flows in the length direction, that is, in the direction perpendicular to the plane of the paper in FIG. 4 and FIG. 5, and thermoelectric conversion is performed. And the oxide additional layer 22 is formed on the surface of the single crystal 10 with the above-described concave-convex structure, and thus has a quasi-one-dimensional structure. Further, the oxide additional layer 22 supplies electrons to the single crystal 10, so that the efficiency ZT of the thermoelectric conversion structure 120 is satisfactory.

1-5-2 Rock Salt Structure Oxide Additional Layer

Another modified example of the embodiment is a thermoelectric conversion structure 110 having a rock salt structure oxide additional layer 21 as a carrier-doping structure 20. Preferred materials for this oxide additional layer 21 include, among lanthanide oxides, LaO, PrO and NdO in particular. The rock salt crystal structure in these materials has lattice positions at positions substantially corresponding to the cubic perovskite structure crystal lattice of the single crystal 10. For this reason, the oxide additional layer 21 can be grown epitaxially on the crystal lattice of the single crystal 10. This oxide additional layer 21, similarly to the oxide additional layer 22, is discontinuous in the direction of the [1-20] axis with gaps occurring due to the concave-convex structure created by the terrace portions 12, 14 and step portions 16, 18 of the single crystal 10, and is divided into strips. In this way the carrier-doping structure 20 effectively forms a quasi-one-dimensional structure.

1-6 Advantageous of a Quasi-One-Dimensional Structure for the Oxide Additional Layer In the carrier-doping structures 20 described above, the advantage of the effectively quasi-one-dimensional structure assumed by the oxide additional layers 21 and 22 is that electron doping of the quasi-one-dimensional electronic structure, already squeezed by the concave-convex structure of the surface or interface, is performed selectively only at positions of contact of the oxide additional layer 21 or 22. Hence as a result of the effectively quasi-one-dimensional structure of the oxide additional layers 21 and 22, the one-dimensional nature of the electronic system, which had already become a quasi-one-dimensional electronic structure as a consequence of squeezing, is expressed still more clearly.

1-7 Other Modes of the Oxide Additional Layer

Figure 6:
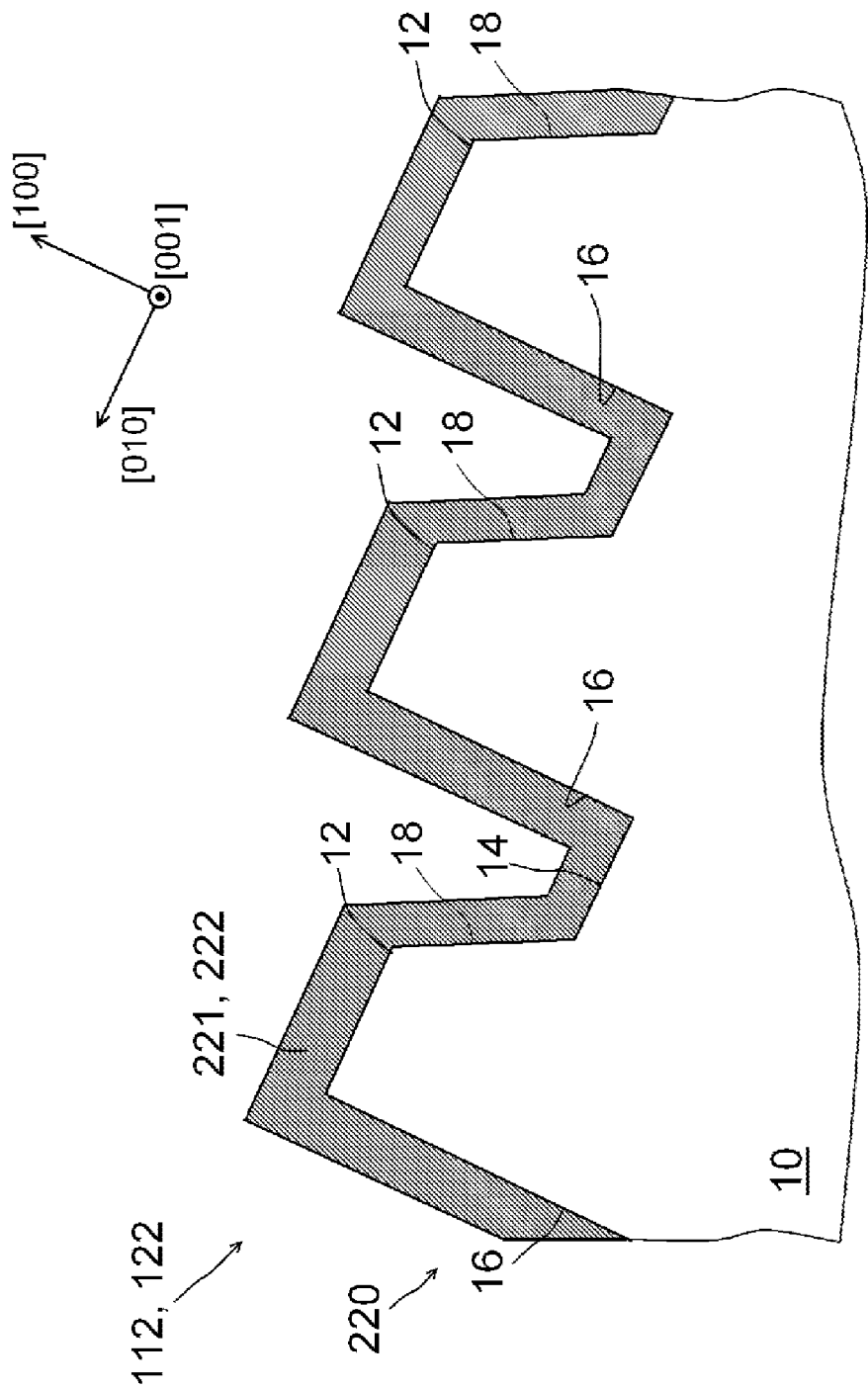
FIG. 6 is a schematic cross-sectional view of a thermoelectric conversion structure having a carrier-doped structure comprising an oxide additional layer on a concave-convex structure, in one embodiment of the invention.

This embodiment also includes oxide additional layers with other structures. FIG. 6 is a schematic cross-sectional view of thermoelectric conversion structures 112 and 122 in which is formed a carrier-doping structure 220 comprising an oxide additional layer 221 or 222 on the concave-convex structure. Materials preferred as the oxide additional layer 221 include, among the lanthanide oxides having the above-described rock salt crystal structure, LaO, PrO and NdO in particular. Materials preferred as the oxide additional layer 222 include perovskite type crystal structure oxides having at the A site La, Pr or Nd in particular among the lanthanides. Even in the case of a carrier-doping structure 220 which is formed continuously in contact with the surface of the concave-convex structure of the single crystal 10 as shown in FIG. 6, electron doping effectively occurs in the regions of the electron distribution E shown in FIG. 4. Hence in a carrier-doping structure of this embodiment, gaps causing discontinuity need not necessarily be formed in the surface of the concave-convex structure, as in the carrier-doping structure 22 shown in FIG. 5.

2 METHOD OF MANUFACTURE

Figure 7:
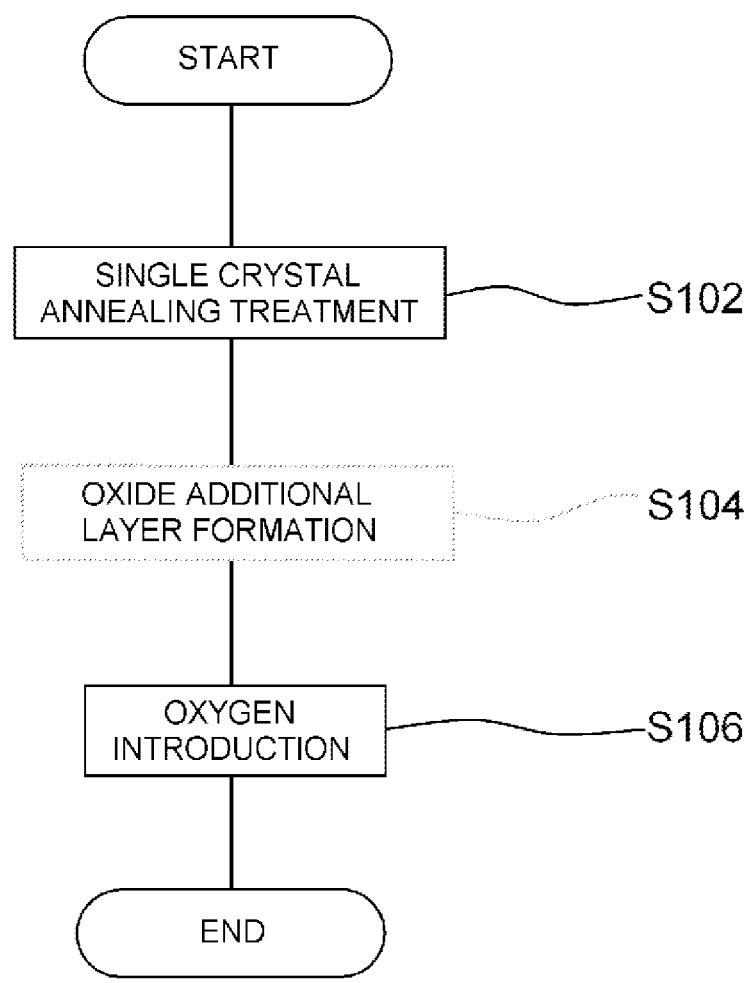
FIG. 7 is a flowchart showing a procedure for manufacturing a thermoelectric conversion structure, in one embodiment of the invention.

Next, a method of manufacturing the thermoelectric conversion structures 100, 110 and 120 of this embodiment is explained. FIG. 7 is a flowchart showing the procedure to manufacture the thermoelectric conversion structures 100, 110 and 120 of this embodiment. Manufacturing of the thermoelectric conversion structure 100 and similar begins by annealing a single crystal in air, to fabricate a concave-convex structure in the surface of the single crystal 10 (S102).

When a thermoelectric conversion structure 110 or 120 is to be fabricated, next an oxide additional layer 21 or 22 is formed. For example, when fabricating a thermoelectric conversion structure 110, the oxide additional layer 21 is formed on the concave-convex structure (S104). As a specific example, a laser ablation method is used to grow LaO as the oxide additional layer 21 formed on the concave-convex structure of the $SrTiO_3$ single crystal. At this time, a disc 20 mm in diameter and 5 mm thick of a polycrystalline material, obtained by using a solid phase reaction method to sinter $La_2O_3$ powder, is used as the target. As the detailed procedure, first the single crystal 10, which is a $SrTiO_3$ (210) single crystal, is mounted in a vacuum chamber, which is evacuated to $3\times10^{-9}$ Torr ($4\times10^{-7}$ Pa) or lower. Then, high-purity oxygen gas is introduced into the vacuum chamber to 1 mTorr (13.3 Pa), and the single crystal 10, on which the concave-convex structure is already formed, is heated to a final temperature of 850° C. The temperature of the single crystal 10 during this film deposition is lower than the 1180° C. temperature used in annealing the single crystal during formation of the concave-convex structure, so that the concave-convex structure formed in the surface of the single crystal 10 is not affected by the abovementioned heating of the single crystal during the laser ablation method. Next, the target is irradiated via a laser light introduction port in the chamber with 150 pulses of light from a KrF excimer laser of wavelength 248 nm, to grow LaO on the concave-convex structure to a film thickness equivalent to 5 unit cells. These conditions are decided by confirming in advance that irradiation of 30 pulses by the excimer laser is sufficient to cause two-dimensional growth of a layer of LaO equivalent to one unit cell on the abovementioned $SrTiO_3$ single crystal having a flat surface (100).

In this growth of the oxide additional layer 21, conditions are selected so as to epitaxially grow the oxide additional layer 21, which is LaO, corresponding to lattice points of the single crystal 10 of $SrTiO_3$, even while maintaining the rock salt structure. To this end, in order to confirm crystallinity during growth of the oxide additional layer 21, in situ observations by RHEED (reflection high-energy electron diffraction) are effective. That is, the single crystal 10, which is a (210) orientation single crystal, is anisotropic, and when an electron beam is incident parallel to the in-plane [001] axis, diffraction by the (1-20) planes is obtained. When such observations are actually made, diffraction patterns from for example the (100) planes and the (010) planes are seen. This diffraction pattern can be confirmed to be formed by the thin film of the oxide additional layer 21 in a configuration including (100) plane terrace portions and (010) plane step portions 16 and 18 similarly to the concave-convex structure in the surface of the single crystal 10, that is, in a template of the concave-convex structure of the single crystal 10. Similarly, in RHEED patterns, by making the beam incident parallel to the in-plane [1-20] axis, information relating to the in-plane (001) plane is also obtained. When the electron beam is made incident parallel to the [1-20] axis, a RHEED pattern comprising streaks is observed, and flat single-crystal epitaxial growth occurs at nm levels without the formation of steps in the [001] axis direction. As a result, it is confirmed that a concave-convex structure such as that shown in FIG. 4 is obtained.

Thereafter, annealing is performed in situ at 400° C., and oxygen is added (S106). As explained above, the concave-convex structure is formed so as to have sufficiently large height differences, so that in the carrier-doping structure 20 formed thereupon, the thickness of the oxide additional layer 21 formed on the surface of the concave-convex structure of the single crystal 10 is regulated by the film thickness in the direction perpendicular to the surface. Further, oxide additional layer portions 21 which are adjacent in the [1-20] direction are separated by the height differences created by the step portions 16, 18 of the concave-convex structure. In this way, the oxide additional layer 21 is formed so as to result in a quasi-one-dimensional structure.

In this way, a thermoelectric conversion structure 100 can be fabricated by single crystal annealing treatment S102 and oxygen introduction S106. Further, a thermoelectric conversion structure 110 can be fabricated by single crystal annealing treatment S102, oxide additional layer formation S104, and oxygen introduction S106. A thermoelectric conversion structure 120 can also be fabricated by single crystal annealing treatment S102, oxide additional layer formation S104, and oxygen introduction S106.

3 EXAMPLE AND COMPARATIVE EXAMPLE

3-1 Example

Below, the invention is explained in detail for the case of an example. The materials, amounts used, proportions, details of treatments, treatment procedures, and the orientations and specific dispositions of elements or members, and similar described in the following example can be modified appropriately without deviating from the gist of the invention. Hence the scope of the invention is not limited to the following specific example. A sample of the example was fabricated having the same structure as the above-described thermoelectric conversion structure 120, that is, with LaO deposited to 5 unit cells as the oxide additional layer, and the figure of merit Z of the thermoelectric conversion structure of the example sample was determined. Specifically, Al electrodes were formed on both ends of the example sample in the [001] axis direction, and the Seebeck coefficient S, resistivity ρ and thermal conductivity κ of the thermoelectric conversion structure 100 were measured at room temperature (300 K) via the Al electrodes. As a result, an efficiency ZT of approximately 3.3 (T=300 K) is obtained, far superior to the efficiency ZT of approximately 0.3 (and if limited only to the superlattice interface, ZT>2) reported for a superlattice comprising Nb-doped $SrTiO_3$ and $SrTiO_3$. As the reason why such a characteristic is obtained, the inventor of this application attributes the result to the quasi-one-dimensional structure of the electron spatial distribution of the $SrTiO_3$ doped with electrons from the LaO in this invention. Further, excellent values of 3.9 and 2.4 (T=300 K) were obtained for the efficiency ZT of two types of samples in which, similarly to LaO, PrO and NdO were deposited to 5 unit cells as the oxide additional layer. As the reason for obtaining an excellent characteristic when PrO was selected as the oxide additional layer, it is thought that the lattice of PrO is small compared with LaO, so that strain at the interface with the $SrTiO_3$ is increased. In other words, it is thought that the reduced resistivity and reduced thermal conductivity resulting from the improvement in mobility arising due to the strain contribute to the improvement in ZT. It is further noted that, even when perovskite structure $LaAlO_3$ is deposited to 5 unit cells as the oxide additional layer, a high efficiency ZT of 3.2 is obtained (T=300 K).

3-2 Comparative Example

Upon determining the figure of merit Z similarly for a thermoelectric element for which the number of LaO layers fabricated similarly to that above is 3 unit cells, ZT was approximately 0.01. This is attributed to the fact that when the number of LaO layers is thin, a quasi-one-dimensional structure results in electrons not effectively doping the $SrTiO_3$, so that ρ increases by several orders of magnitude.

As explained above, near the surface of a (210) orientation $SrTiO_3$ single crystal, an electron spatial distribution with a quasi-one-dimensional structure is formed in the $SrTiO_3$ substrate by a concave-convex structure including terrace portions based on (100) planes and step portions extending along in-plane [001] axes. When, on the concave-convex structure, either a rock salt structure oxide additional layer (any one among LaO, PrO and NdO) having the property of doping electrons, or an oxide additional layer with a perovskite type structure in which any one among La, Pr and Nd is present at the A sites and similarly having the property of doping electrons is formed, a degenerate semiconductor in which the electron spatial distribution has a quasi-one-dimensional structure is fabricated. The abovementioned concave-convex structure can be formed simply and with good reproducibility merely by annealing the (210) orientation $SrTiO_3$ substrate in air. Further, in this concave-convex structure, terrace portions are formed from (100) planes, in contrast with the steps and bunched steps normally used, and so are inclined and are not uniform in the [1-20] axis direction. Hence merely by depositing thermoelectric conversion material under two-dimensional growth conditions when forming an oxide additional layer which becomes electron doping material, the oxide additional layer becomes discontinuous due to step portions which partition the terrace portions. That is, in this embodiment, electron doping can be performed reliability, even while maintaining the quasi-one-dimensional structure, in an electron spatial distribution which has already assumed a quasi-one-dimensional structure. As a result, in this embodiment, electron doping in the electron spatial distribution with a quasi-one-dimensional structure is performed appropriately in the thermoelectric conversion structure using an oxide. In the thermoelectric conversion structure obtained in this way, performance is improved extremely simply and with good reproducibility. The compositions, film thicknesses, methods of formation and similar in this embodiment are not limited to those of the abovementioned embodiment.

As explained above, thermoelectric conversion material (here, La-doped $SrTiO_3$) formed on a concave-convex structure defined by the [001] axis and (010) planes of the surface of (210) oriented $SrTiO_3$ substrate is formed on a surface which produces this concave-convex structure. By this means, the electron spatial distribution assumes a quasi-one-dimensional structure. On this an $SrTiO_3$ insulating layer is formed, and by repeating this sequence, integration of quasi-one-dimensional thermoelectric conversion material is possible. As already explained, this concave-convex structure is formed simply and with good reproducibility merely by annealing in air of the (210) orientation $SrTiO_3$ substrate. This is because steps are formed autonomously by the crystal axes and crystal faces. In contrast with ordinary steps and bunched steps, the concave-convex structure heights on terraces are not uniform in the [1-20] axis direction, and so merely by depositing thermoelectric conversion material using two-dimensional growth conditions, discontinuity occurs at step portions, and wire structures can be fabricated easily and reliably. Hence compared with two-dimensional structure fabrication, no particular equipment or processes are required, and thermoelectric conversion material is obtained which enables improved performance through the quasi-one-dimensional structure. The compositions, film thicknesses, methods of formation and similar in this embodiment are not limited to those of the abovementioned embodiment.

The materials and compositions, film thicknesses, methods of formation and similar of the thin films and single crystals exemplified in this embodiment are not limited to those of the abovementioned embodiment. Further, as is known by a person skilled in the art, the names of the axes and planes of the perovskite crystals described for purposes of explanation can be represented by other equivalent representations. For example, even when a crystal axis extending along the surface of a single crystal is represented as a [001] axis, two settings for the axis, which are mutual inversions, are conceivable. Further, for each of the settings of the [001] axis, there is arbitrariness in the settings of the [100] axis and the [010] axis. Hence when for example a right-hand system is used to determine an axis, the plane represented as the (m10) plane, represented by a separate axis representation method based on a right-hand system, becomes the (1m0) plane, and thus it must be remembered that separate representations are possible for equivalent planes.

In the above, embodiments of the invention have been explained in detail. The above-described embodiments and examples are set forth to explain the invention, and the scope of the invention of this invention should be determined based on the scope of claims. Further, modified examples existing within the scope of the invention, including other combinations of embodiments, are also included in the scope of claims.

INDUSTRIAL APPLICABILITY

This invention can be used to obtain thermoelectric elements which generate electricity using temperature differences in an environment.

EXPLANATION OF REFERENCE NUMERALS

100, 110, 112, 120, 122 Thermoelectric conversion structure
10 Single crystal
12, 12A, 12B, 12C (100) plane (top terrace portion)
14, 14A, 14B, 14C (100) plane (bottom terrace portion)
16, 16A, 16B, 16C Step portion ((010) plane)
18, 18A, 18B, 18C Step portion (reverse-step)
20 Carrier-doping structure
21, 221 Oxide additional layer (rock salt structure)
22, 222 Oxide additional layer (perovskite structure)

The invention claimed is:

1. A thermoelectric conversion structure, comprising:
a $SrTiO_3$ single crystal having a surface at a (210) plane,
wherein the surface of the crystal has a concave-convex structure that has a terrace portion on a (100) plane and a step portion extending along an in-plane [001].

2. The thermoelectric conversion structure according to claim 1, further comprising an oxide additional layer having a rock salt crystal structure that includes at least one of LaO, PrO and NdO, the rock salt crystal structure being formed upon at least a portion of the concave-convex structure and in contact with the surface of the crystal.

3. The thermoelectric conversion structure according to claim 1, further comprising an oxide additional layer having a perovskite type crystal structure that includes at least one of La, Pr and Nd, the perovskite type crystal being formed upon at least a portion of the concave-convex structure and in contact with the surface.

4. The thermoelectric conversion structure according to claim 3, wherein the oxide additional layer has a thickness of 5 unit cells or greater when measured in a direction of a [100] axis of the thermoelectric conversion structure.

5. The thermoelectric conversion structure according to claim 4, wherein the thickness of the oxide additional layer is equal to or less than a difference in heights of the concave-convex structure.

6. A method of manufacturing a thermoelectric conversion structure, comprising the steps of:
providing a $SrTiO_3$ single crystal having a (210) plane surface; and
forming a concave-convex structure including a terrace portion on a (100) plane of the crystal and a step portion extending along an in-plane [001] axis of the crystal by annealing the crystal in air.

7. The method of manufacturing a thermoelectric conversion structure according to claim 6, further comprising the step of forming an oxide additional layer, having either a rock salt crystal structure or a perovskite type crystal structure, in contact with at least a portion of a surface of the concave-convex structure.

8. A thermoelectric conversion structure, comprising:
a $SrTiO_3$ single crystal having a surface at a (210) plane, and
an oxide additional layer having a rock salt crystal structure that includes at least one of LaO, PrO and NdO, the rock salt crystal structure being formed upon at least a portion of the concave-convex structure and in contact with the surface of the crystal,
wherein the surface of the crystal has a concave-convex structure that has a terrace portion on a (100) plane and a step portion extending along an in-plane [001] axis, and
wherein the oxide additional layer has a thickness of 5 unit cells or greater when measured in a direction of a [100] axis of the thermoelectric conversion structure.

9. The thermoelectric conversion structure according to claim 8, wherein the thickness of the oxide additional layer is equal to or less than a difference in heights of the concave-convex structure.

* * * * *